(12) United States Patent
Yan et al.

(10) Patent No.: US 9,679,893 B2
(45) Date of Patent: Jun. 13, 2017

(54) SEMICONDUCTOR DEVICE AND TRANSISTOR

(71) Applicants: Taiwan Semiconductor Manufacturing Company Limited, Hsinchu (TW); National Taiwan University, Taipei (TW)

(72) Inventors: Jhih-Yang Yan, Taipei (TW); Chee-Wee Liu, Taipei (TW); Der-Chuan Lai, Taipei (TW)

(73) Assignees: Taiwan Semiconductor Manufacturing Company Limited (TW); National Taiwan University (TW)

( * ) Notice: Subject to any disclaimer, the term of this patent is extended or adjusted under 35 U.S.C. 154(b) by 68 days.

(21) Appl. No.: 14/713,000

(22) Filed: May 15, 2015

(65) Prior Publication Data

US 2016/0336312 A1 Nov. 17, 2016

(51) Int. Cl.
*H01L 27/07* (2006.01)
*H01L 29/78* (2006.01)
*H01L 49/02* (2006.01)

(52) U.S. Cl.
CPC .......... *H01L 27/0711* (2013.01); *H01L 28/55* (2013.01); *H01L 29/78* (2013.01)

(58) Field of Classification Search
None
See application file for complete search history.

(56) References Cited

U.S. PATENT DOCUMENTS

| | | | | | |
|---|---|---|---|---|---|
| 5,523,964 | A | * | 6/1996 | McMillan | G11C 11/22 257/295 |
| 5,650,645 | A | * | 7/1997 | Sone | H01L 27/0629 257/277 |
| 5,699,290 | A | * | 12/1997 | Yoo | G11C 11/22 365/145 |
| 6,048,738 | A | * | 4/2000 | Hsu | G11C 11/22 257/E21.208 |
| 6,072,711 | A | * | 6/2000 | Kang | G11C 11/22 257/E21.68 |
| 6,141,238 | A | * | 10/2000 | Forbes | G11C 11/005 257/E27.104 |
| 6,515,889 | B1 | * | 2/2003 | Salling | G11C 11/22 365/145 |
| 6,642,563 | B2 | * | 11/2003 | Kanaya | H01L 21/28273 257/295 |

(Continued)

*Primary Examiner* — Michael Lebentritt
*Assistant Examiner* — Jordan Klein
(74) *Attorney, Agent, or Firm* — Jones Day

(57) ABSTRACT

This disclosure provides a negative capacitance gate stack structure with a variable positive capacitor to implement a hysteresis free negative capacitance field effect transistors (NCFETs) with improved voltage gain. The gate stack structure provides an effective ferroelectric negative capacitor by using the combination of a ferroelectric negative capacitor and the variable positive capacitor with semiconductor material (such as polysilicon), resulting in the effective ferroelectric negative capacitor's being varied with an applied gate voltage. Our simulation results show that the NCFET with the variable positive capacitor can achieve not only a non-hysteretic $I_D$-$V_G$ curve but also a better sub-threshold slope.

20 Claims, 8 Drawing Sheets

(56) References Cited

U.S. PATENT DOCUMENTS

| | | | | |
|---|---|---|---|---|
| 2001/0019497 | A1* | 9/2001 | Shimada | G11C 11/22 365/145 |
| 2002/0142487 | A1* | 10/2002 | Li | H01L 21/28291 438/3 |
| 2003/0011436 | A1* | 1/2003 | Shigematsu | H03F 3/607 330/311 |
| 2003/0235066 | A1* | 12/2003 | Forbes | G11C 17/04 365/145 |
| 2003/0235067 | A1* | 12/2003 | Sakai | G11C 11/22 365/145 |
| 2010/0140589 | A1* | 6/2010 | Ionescu | B82Y 10/00 257/24 |
| 2010/0321857 | A1* | 12/2010 | Habu | H01G 7/06 361/281 |
| 2012/0292677 | A1* | 11/2012 | Dubourdieu | H01L 29/42316 257/295 |
| 2015/0214322 | A1* | 7/2015 | Mueller | G11C 11/22 257/295 |
| 2015/0287802 | A1* | 10/2015 | Lee | H01L 29/516 257/105 |
| 2015/0318285 | A1* | 11/2015 | Zhang | H01L 27/10844 257/295 |
| 2016/0005749 | A1* | 1/2016 | Li | H01L 27/11521 257/295 |
| 2016/0207761 | A1* | 7/2016 | Alam | H01L 29/78391 |

* cited by examiner

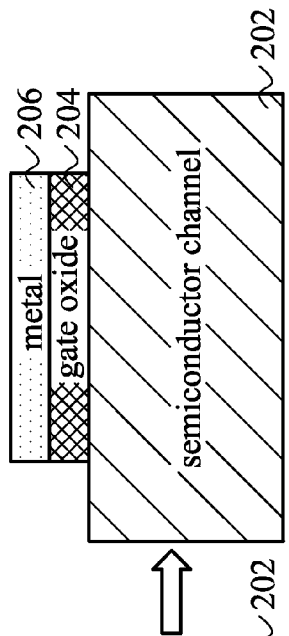
Fig. 2A
Fig. 2B
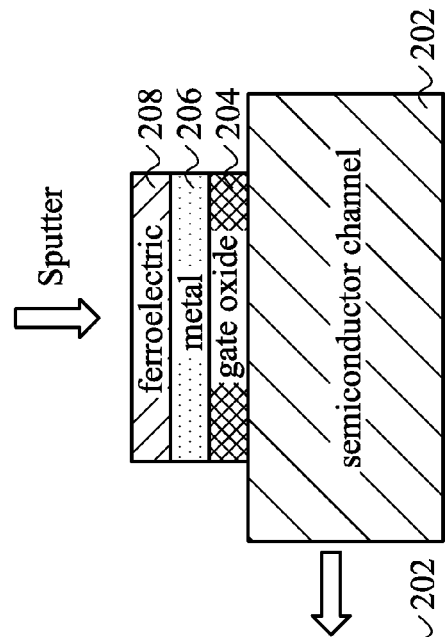
Fig. 2C
Fig. 2D
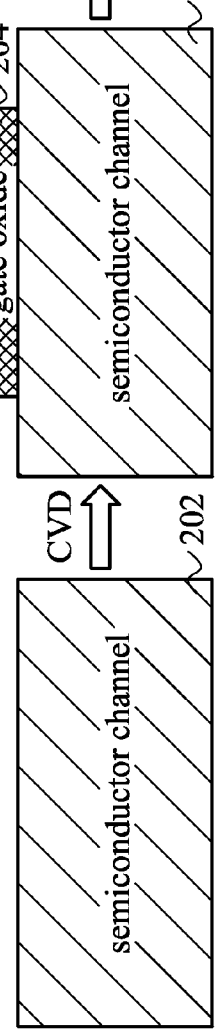
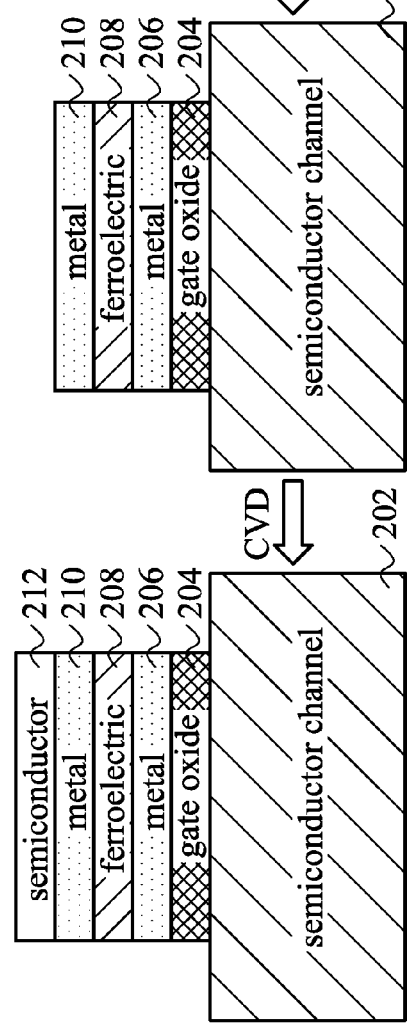
Fig. 2E
Fig. 2F

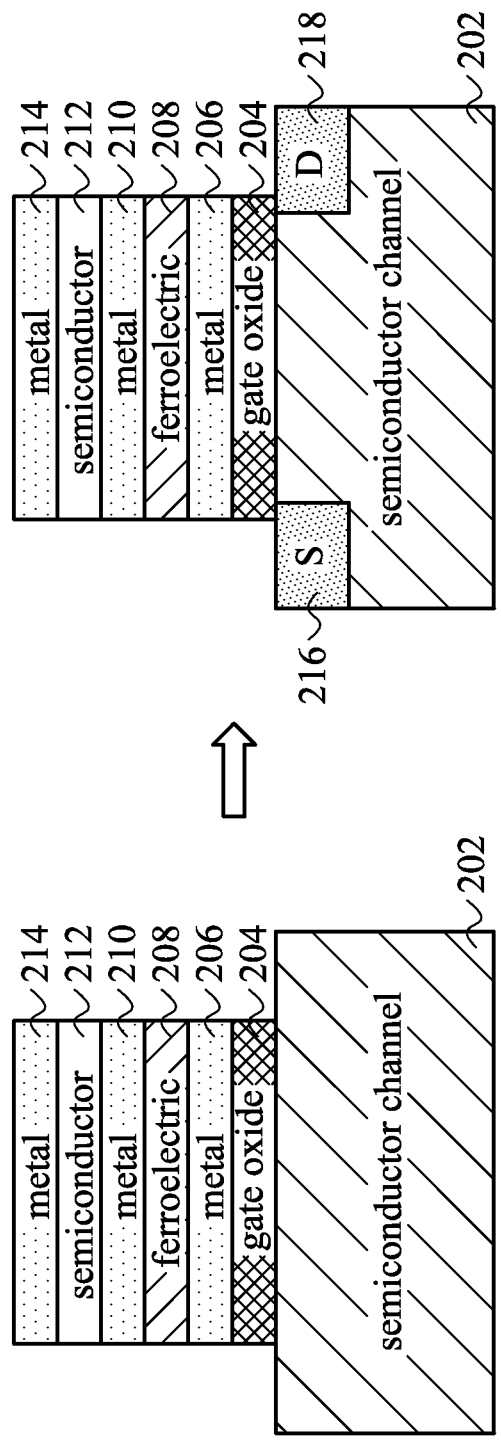

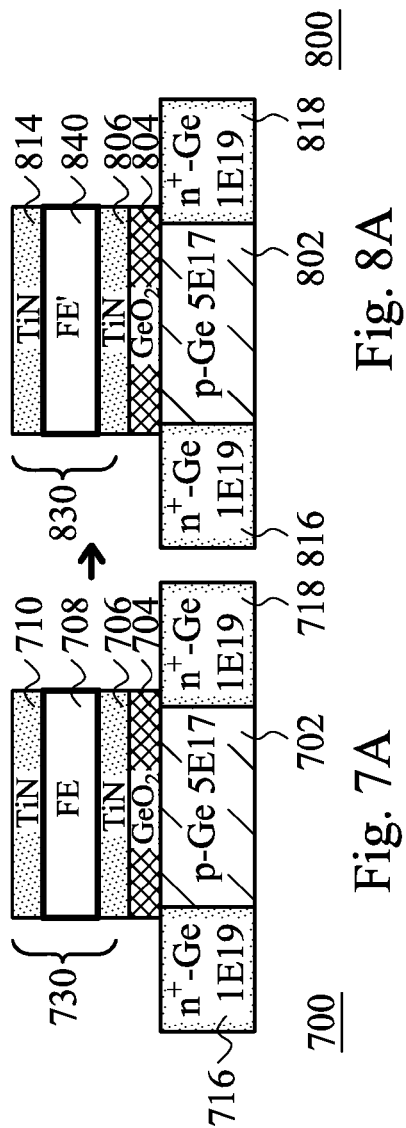
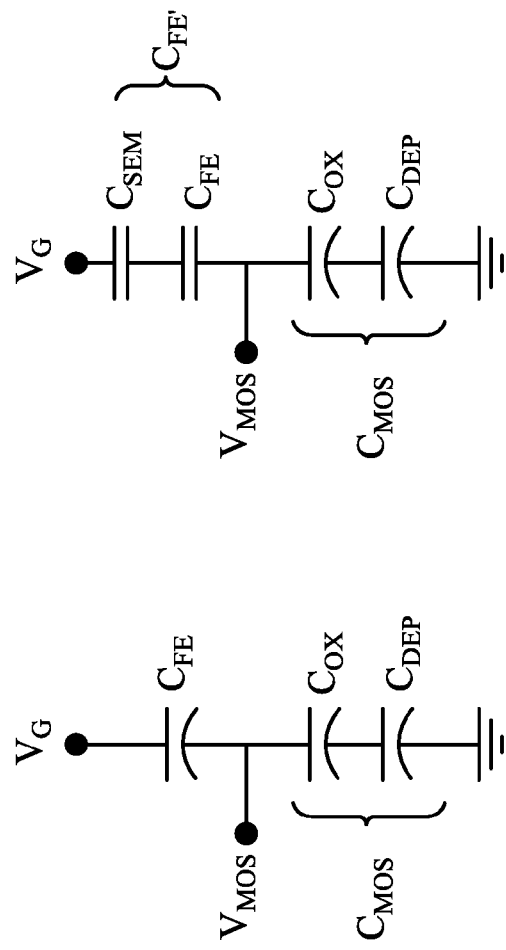
Fig. 7A Fig. 7B
Fig. 8A Fig. 8B

US 9,679,893 B2

SEMICONDUCTOR DEVICE AND TRANSISTOR

BACKGROUND

The subthreshold swing is a feature of a transistor's current-voltage characteristic. In the subthreshold region the drain current behavior is similar to the exponentially increasing current of a forward biased diode. A plot of logarithmic drain current versus gate voltage with drain, source, and bulk voltages fixed will exhibit approximately log linear behavior in this MOSFET operating region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A-2H are sectional views of an exemplary semiconductor device at one stage during fabrication of hysteresis free negative capacitance field effect transistors in accordance with some embodiments.

FIG. 7A is a sectional view of an exemplary semiconductor device 700 in accordance with some embodiments.

FIG. 7B is a simplified capacitance model of a gate structure of an exemplary semiconductor device 700 in accordance with some embodiments.

FIG. 8A is a sectional view of an exemplary semiconductor device 800 having hysteresis free negative capacitance field effect transistors in accordance with some embodiments.

FIG. 8B is a simplified capacitance model of a gate structure of an exemplary semiconductor device 800 in accordance with some embodiments.

DETAILED DESCRIPTION

Figure 1:
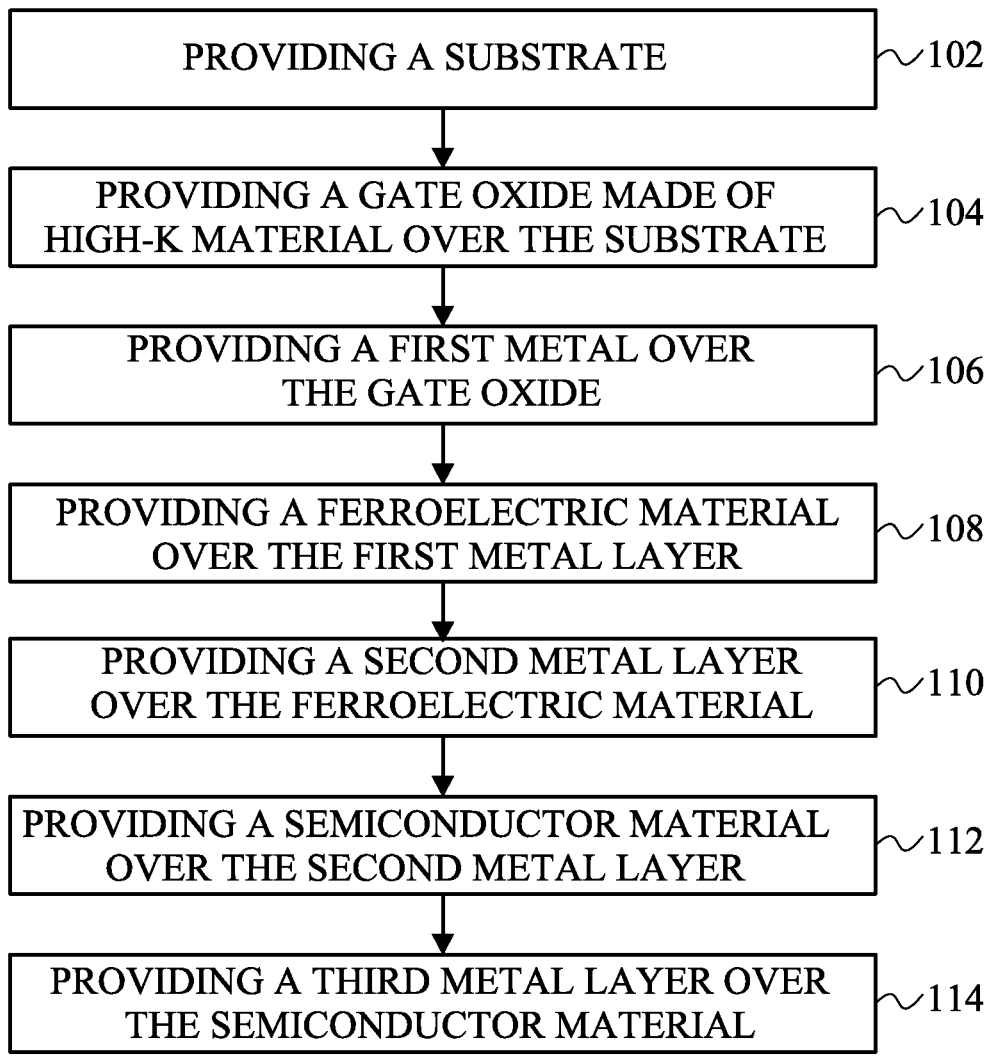
FIG. 1 is a flow chart of a method of fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure provides a negative capacitance gate stack structure with a variable positive capacitor to implement a hysteresis free negative capacitance field effect transistors (NCFETs) with improved voltage gain. The gate stack structure provides an effective ferroelectric negative capacitor by using a combination of a ferroelectric negative capacitor and a variable positive capacitor with semiconductor material (such as polysilicon and IGZO (indium gallium zinc oxide)), resulting in the effective ferroelectric negative capacitor's being varied with an applied gate voltage. Simulation results show that the NCFET with the variable positive capacitor can achieve not only a non-hysteretic $I_D$-$V_G$ curve but also a better sub-threshold slope. In some embodiments, the negative capacitance gate stack may be realized on the device selected from the group consisting of planar devices, multi-gate devices, FinFETs, and gate-all-around FETs.

FIG. 1 is a flow chart of a method of fabricating a semiconductor device in accordance with some embodiments. As shown in FIG. 1 and referring to FIGS. 2A-2H, the method 100 begins with the provision of a substrate 202 (operation 102). A gate oxide 204 made of high-K material is then provided over the substrate 202 by using chemical vapor deposition (CVD) (operation 104). A first metal, for example, metal 206, is provided over the gate oxide 204 (operation 106). A ferroelectric material 208, for example, $PbZr_{0.5}Ti_{0.5}O_3$ or $Hf_{0.5}Zr_{0.5}O_2$, is provided over the first metal 206 by using sputter deposition (operation 108). A second metal layer 210 is provided over the ferroelectric material 208 (operation 110). A semiconductor material 212, for example, polysilicon, is provided over second metal layer 210 (operation 112) by using chemical vapor deposition (CVD). A third metal layer 214 is provided over the semiconductor material 212 (operation 114).

FIG. 2A is a sectional view of an exemplary semiconductor device at one stage during fabrication of hysteresis free negative capacitance field effect transistors in accordance with some embodiments. As shown in FIG. 2A, a substrate 202 is provided (e.g., operation 102 of FIG. 1). The material of the substrate 202 may include, for example, Si, SiGe, Ge, or III-V (InP, GaAs, AlAs, InAs, InAlAs, InGaAs, InSb, GaSb, InGaSb). A portion of the substrate 202 may be doped to be a p-type germanium with a doping concentration of about 5 e17/cm^3 as a semiconductor channel.

FIG. 2B is a sectional view of an exemplary semiconductor device at one stage during fabrication of hysteresis free negative capacitance field effect transistors in accordance with some embodiments. As shown in FIG. 2B, a gate oxide 204 made of high-K material is provided by using chemical vapor deposition (CVD) (e.g., operation 104 of FIG. 1). The high-K material may be a single layer or a multi-layer structure with, for example, $GeO_2$, $HfO_2$, $ZrO_2$, $HfZrO_2$, $Ga_2O_3$, $Gd_2O_3$, $TaSiO_2$, $Al_2O_3$, or $TiO_2$.

FIG. 2C is a sectional view of an exemplary semiconductor device at one stage during fabrication of hysteresis free negative capacitance field effect transistors in accordance with some embodiments. As shown in FIG. 2C, a first metal layer 206 is provided over the gate oxide 204 (e.g., operation 106 of FIG. 1). The first metal 206 may include, for example, TiN.

FIG. 2D is a sectional view of an exemplary semiconductor device at one stage during fabrication of hysteresis free negative capacitance field effect transistors in accordance with some embodiments. As shown in FIG. 2D, a ferroelectric material 208 is provided over the first metal layer 206 by using sputter deposition (e.g., operation 108 of FIG. 1). The ferroelectric material 208 may include, for example, $PbZr_{0.5}Ti_{0.5}O_3$ with a thickness of about 300 nanometers to about 600 nanometers, or $Hf_{0.5}Zr_{0.5}O_2$ with a thickness of about 5 nanometers to about 50 nanometers.

FIG. 2E is a sectional view of an exemplary semiconductor device at one stage during fabrication of hysteresis free negative capacitance field effect transistors in accordance with some embodiments. As shown in FIG. 2E, a second metal layer 210 is provided over the ferroelectric material 208 (e.g., operation 110 of FIG. 1). The second metal layer 210 may include, for example, TiN.

FIG. 2F is a sectional view of an exemplary semiconductor device at one stage during fabrication of hysteresis free negative capacitance field effect transistors in accordance with some embodiments. As shown in FIG. 2F, a semiconductor material 212 is provided (e.g., operation 112 of FIG. 1). The semiconductor material 212 may include, for example, polysilicon having a doping concentration of about 1 e17/cm^3 to about 1 e19/cm^3 and a thickness of about 10 nanometers to about 100 nanometers. In some embodiments, the semiconductor material 212 may include, for example, indium gallium zinc oxide (IGZO) having a doping concentration of about 1 e16/cm^3 to about 1 e19/cm^3 and a thickness of about 10 nanometers to about 100 nanometers.

FIG. 2G is a sectional view of an exemplary semiconductor device at one stage during fabrication of hysteresis free negative capacitance field effect transistors in accordance with some embodiments. As shown in FIG. 2G, a third metal layer 214 is provided over the semiconductor material 212 (e.g., operation 114 of FIG. 1). The third metal 214 may include, for example, TiN.

FIG. 2H is a sectional view of an exemplary semiconductor device at one stage during fabrication of hysteresis free negative capacitance field effect transistors in accordance with some embodiments. As shown in FIG. 2H, portions 216, 218 of the substrate 202 may be doped to be a n-type germanium with a doping concentration of about 1 e20/cm^3 to about 1 e21/cm^3.

Figure 3:
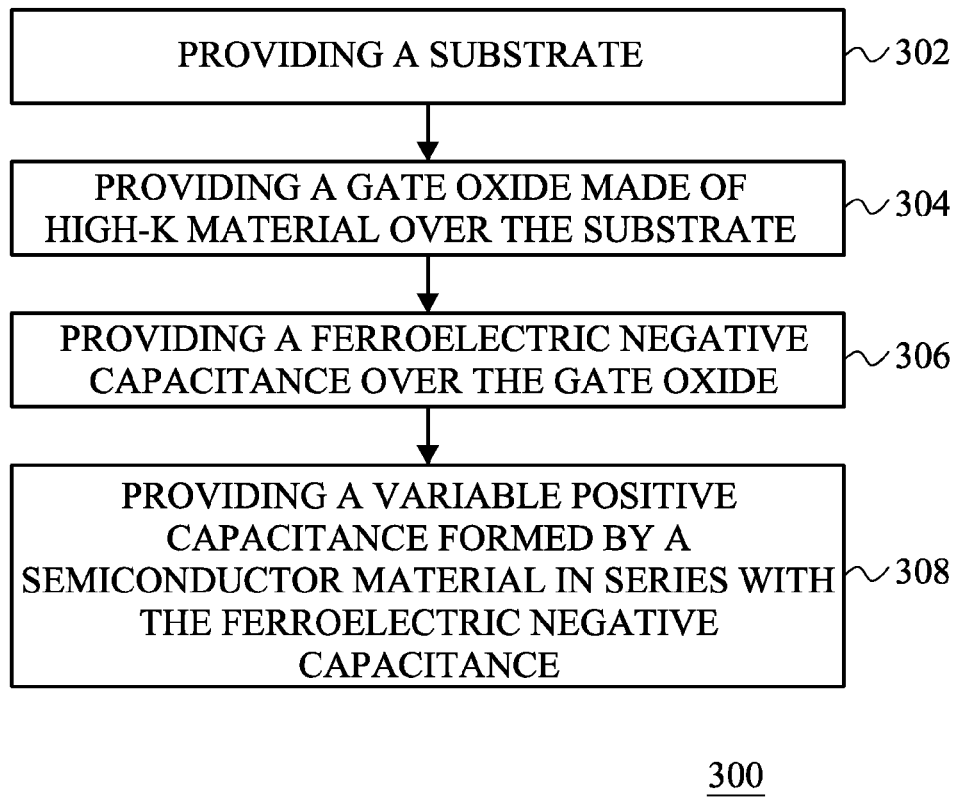
FIG. 3 is a flow chart of a method of fabricating a semiconductor device in accordance with some embodiments.
Figure 4:
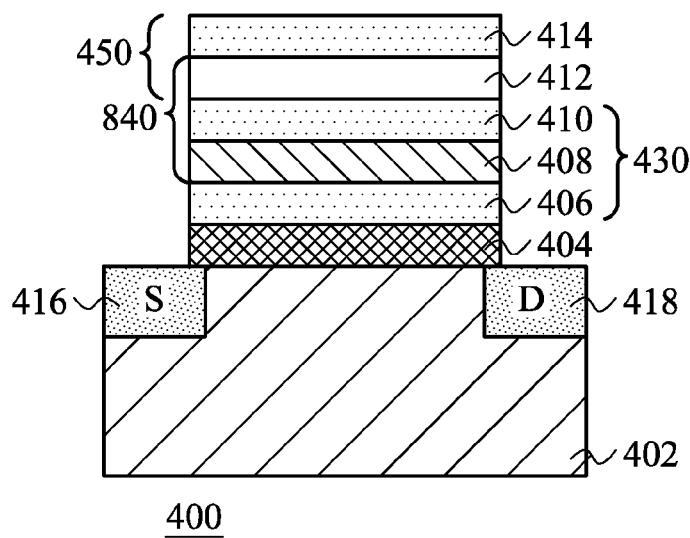
FIG. 4 is a sectional view of an exemplary semiconductor device 400 having hysteresis free negative capacitance field effect transistors in accordance with some embodiments.

FIG. 3 is a flow chart of a method of fabricating a semiconductor device in accordance with some embodiments. FIG. 4 is a sectional view of an exemplary semiconductor device 400 having hysteresis free negative capacitance field effect transistors in accordance with some embodiments. As shown in FIGS. 3 and 4, the method 300 begins with the provision of a substrate 402 (operation 302). The material of the substrate 402 may include, for example, Si, SiGe, Ge, or III-V (InP, GaAs, AlAs, InAs, InAlAs, InGaAs, InSb, GaSb, InGaSb). A portion of the substrate 402 may be doped to be a p-type germanium with a doping concentration of about 5 e17/cm^3.

A gate oxide made of high-K material, for example, gate oxide 404, is then provided over the substrate 402 by using chemical vapor deposition (CVD) (operation 304). The high-K material may be a single layer or a multi-layer structure with $GeO_2$, $HfO_2$, $ZrO_2$, $HfZrO_2$, $Ga_2O_3$, $Gd_2O_3$, $TaSiO_2$, $Al_2O_3$, or $TiO_2$.

Then, a ferroelectric negative capacitor 430 is provided over the gate oxide 404. The ferroelectric negative capacitor 430 is formed of a first metal 406, a ferroelectric material 408, and a second metal layer 410. The first metal layer 406 and the second metal layer 408 may include, for example, TiN. The ferroelectric material 408, for example, $PbZr_{0.5}Ti_{0.5}O_3$ or $Hf_{0.5}Zr_{0.5}O_2$, is provided over the first metal 206 by using sputter deposition.

After the formation of the ferroelectric negative capacitor 430, a variable positive capacitor 450 is formed by a semiconductor material 412 in series with the ferroelectric negative capacitor 430. The variable positive capacitor 450 is formed of the second metal 410, the semiconductor material 412, and a third metal layer 414. The semiconductor material 412 may include, for example, polysilicon having a doping concentration of about 1 e17/cm^3 to about 1 e19/cm^3 and a thickness of about 10 nanometers to about 100 nanometers. In some embodiments, the semiconductor material 412 may include, for example, indium gallium zinc oxide (IGZO) having a doping concentration of about 1 e16/cm^3 to about 1 e19/cm^3 and a thickness of about 10 nanometers to about 100 nanometers. The third metal layer 414 may include, for example, TiN. Furthermore, portions 416, 418 of the substrate 402 may be doped to be an n-type germanium with a doping concentration of about 1 e20/cm^3 to about 1 e21/cm^3.

Figure 5:
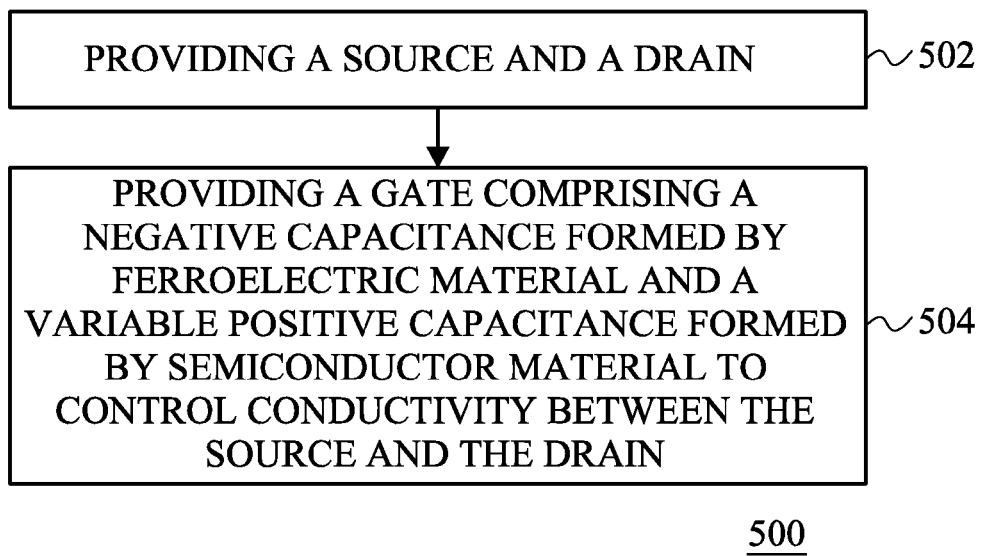
FIG. 5 is a flow chart of a method of fabricating a semiconductor device in accordance with some embodiments.
Figure 6:
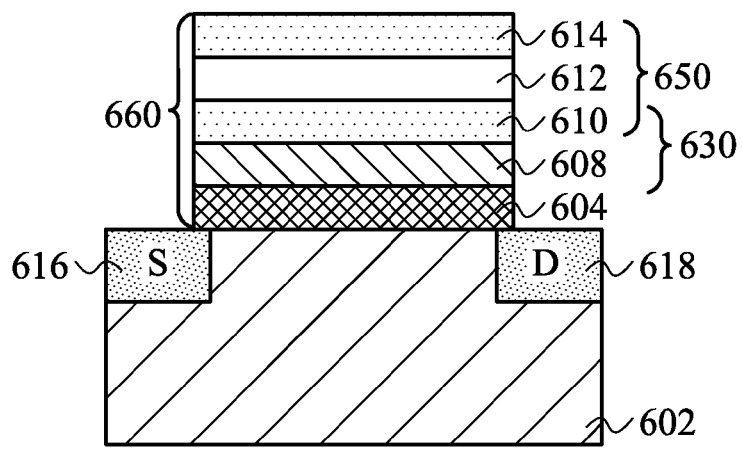
FIG. 6 is a sectional view of an exemplary semiconductor device 600 having hysteresis free negative capacitance field effect transistors in accordance with some embodiments.

FIG. 5 is a flow chart of a method of fabricating a semiconductor device in accordance with some embodiments. FIG. 6 is a sectional view of an exemplary semiconductor device 600 having hysteresis free negative capacitance field effect transistors in accordance with some embodiments. As shown in FIGS. 5 and 6, the method 500 begins with the provision of a source 616 and a drain 618 in the substrate 602. The material of the substrate 602 may include, for example, Si, SiGe, Ge, or III-V (InP, GaAs, AlAs, InAs, InAlAs, InGaAs, InSb, GaSb, InGaSb). A portion of the substrate 202 may be doped to be a p-type germanium with a doping concentration of about 5 e17/cm^3. The source 616 and the drain 618 may be doped to be an n-type germanium with a doping concentration of about 1 e20/cm^3 to about 1 e21/cm^3.

Then, a gate 660 is provided over the substrate 602 to control conductivity between the source 616 and the drain 618. The gate 660 includes a negative capacitor 630 formed by ferroelectric material 608 and a variable positive capacitor 650 formed by semiconductor material 612. The negative capacitor 630 further includes a second metal layer 610, and, as compared to the semiconductor device 400 in FIG. 4, the negative capacitor 630 of the semiconductor device 600 does not have the corresponding first metal 406. The variable positive capacitor 650 further includes the second metal layer 610, the semiconductor material 612, and the third metal layer 614. The semiconductor material 612 may include, for example, polysilicon having a doping concentration of about 1 e17/cm^3 to about 1 e19/cm^3 and a thickness of about 10 nanometers to about 100 nanometers. In some embodiments, the semiconductor material 612 may include, for example, indium gallium zinc oxide (IGZO) having a doping concentration of about 1 e16/cm^3 to about 1 e19/cm^3 and a thickness of about 10 nanometers to about 100 nanometers. The second metal layer 610 and the third metal layer 614 may include, for example, TiN. Furthermore, the gate 660 includes a gate oxide 604 made of high-K material. The high-K material may be a single layer or a multi-layer structure with $GeO_2$, $HfO_2$, $ZrO_2$, $HfZrO_2$, $Ga_2O_3$, $Gd_2O_3$, $TaSiO_2$, $Al_2O_3$, or $TiO_2$.

FIG. 7A is a sectional view of an exemplary semiconductor device 700 in accordance with some embodiments. FIG. 7B is a simplified capacitance model of a gate structure of an exemplary semiconductor device 700 in accordance with some embodiments. As shown in FIG. 7A, a portion of the substrate 702 is doped to be a p-type germanium with a doping concentration of about 5 e17/cm^3 as a semiconductor channel. A gate oxide 704 made of high-K material (such as $GeO_2$) is provided over the substrate 702 by using chemical vapor deposition (CVD). A first metal layer 706 is provided over the gate oxide 704 by using, for example, TiN. Then, a ferroelectric material 708 (such as $PbZr_{0.5}Ti_{0.5}O_3$ or $Hf_{0.5}Zr_{0.5}O_2$) is provided over the first metal layer 706 by using sputter deposition. A second metal layer 710 is provided over the ferroelectric material 708 by using, for example, TiN. The first metal layer 706, the ferroelectric material 708, and the second metal layer 710 forms a ferroelectric negative capacitor 730. The portions 716, 718 of the substrate 702 may be doped to be an n-type germanium with a doping concentration of about 1e20/cm^3 to about 1e21/cm^3.

Next, a simplified capacitance model in FIG. 7B is used to illustrate the concept of the semiconductor device 700. The semiconductor device 700 can be regarded as a MOSFET with an added voltage amplifier. Because of the negative capacitance voltage amplifying effect Av ($Av=\Delta V_{MOS}/\Delta V_G$), subthreshold swing is reduce by a factor of Av. In the subthreshold region, Av and SS (subthreshold slope) can be derived as follows:

$$\Delta V_{MOS}=\Delta V_G * C_{FE}/(C_{FE}+C_{MOS});$$

$$Av=\Delta V_{MOS}/\Delta V_G=|C_{FE}|/(|C_{FE}|-C_{MOS}); \text{ and}$$

$$SS=60*(1+C_{DEP}/C_{OX})/Av=60*(1+C_{DEP}/C_{OX}-C_{DEP}/|C_{FE}|)/Av$$

In order to achieve SS less than 60 mV/dec, $|C_{FE}|$ shall be less than $C_{OX}$. And to obtain a large Av, $|C_{FE}|$ and $C_{MOS}$ shall be relatively close. Additionally, to maintain non-hysteretic operation, $|C_{FE}|$ shall be larger than $C_{MOS}$ throughout the $V_G$ range. Thus, the ferroelectric capacitor shall be—$C_{MOS}<|C_{FE}|<C_{OX}$—to attain non-hysteretic operation and good SS less than 60 mV/dec.

FIG. 8A is a sectional view of an exemplary semiconductor device 800 having hysteresis free negative capacitance field effect transistors in accordance with some embodiments. FIG. 8B is a simplified capacitance model of a gate structure of an exemplary semiconductor device 800 in accordance with some embodiments. As shown in FIG. 8A, a portion of the substrate 802 is doped to be a p-type germanium with a doping concentration of about 5 e17/cm^3 as a semiconductor channel. A gate oxide 804 made of high-K material (such as $GeO_2$) is provided over the substrate 802 by using chemical vapor deposition (CVD). A first metal layer 806 is provided over the gate oxide 804 by using, for example, TiN. Then, referring to FIG. 4 simultaneously, an effective ferroelectric material 840 includes a ferroelectric material 408, a second metal layer 410, and a semiconductor material (such as polysilicon) 412. A third metal layer 814 is provided over the effective ferroelectric material 840 by using, for example, TiN.

Figure 9A:
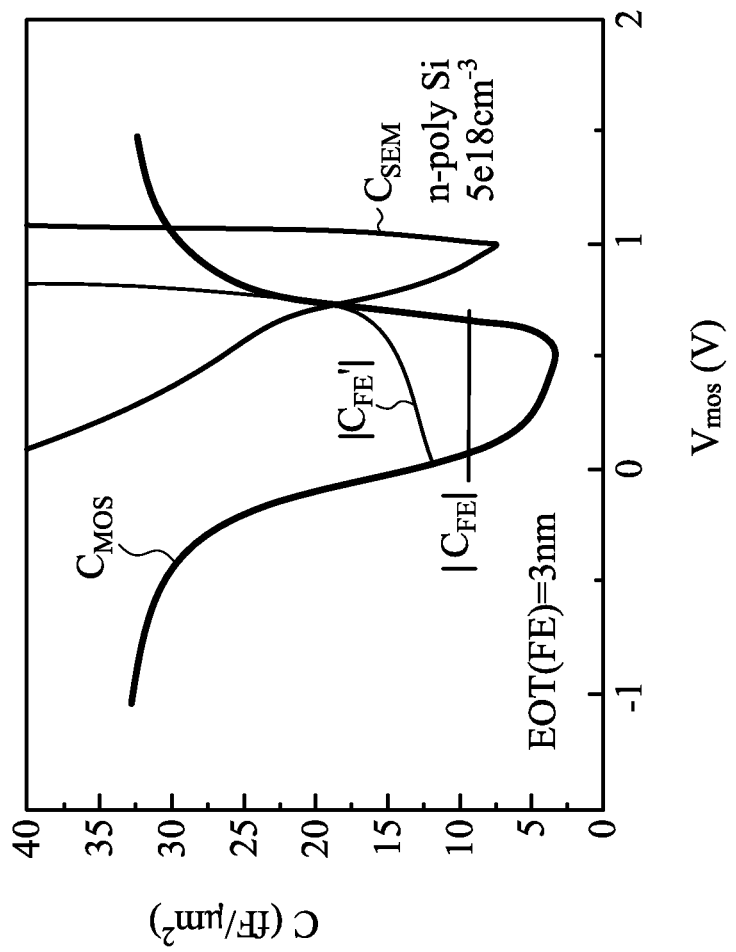
FIGS. 9A-9C show simulation results of exemplary semiconductor devices in accordance with some embodiments.
Figure 9C:
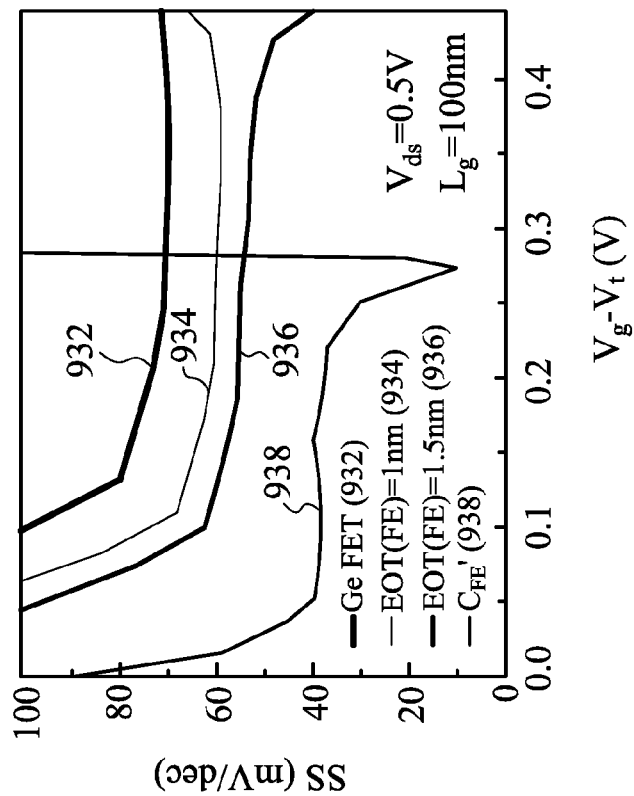
Figure 9B:
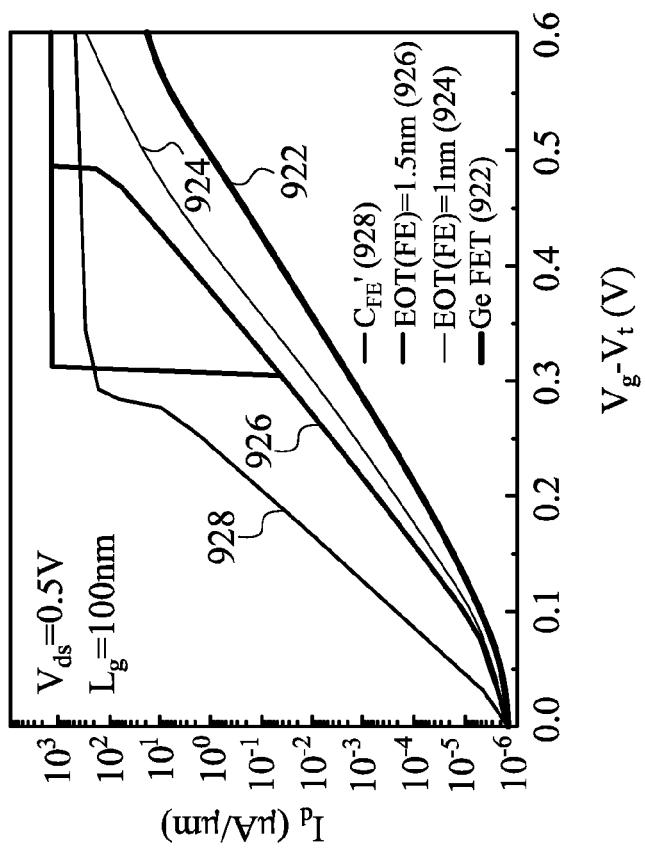

The first metal layer 806, the ferroelectric material 840, and the third metal layer 814 forms an effective ferroelectric negative capacitor $C_{FE}'$ which includes a variable positive capacitor $C_{SEM}$ and a ferroelectric negative capacitor $C_{FE}$. The portions 816, 818 of the substrate 802 may be doped to be an n-type germanium with a doping concentration of about 1 e20/cm^3 to about 1 e21/cm^3. Similar to the analysis to FIG. 7B, from FIGS. 8A and 8B we also conclude that the ferroelectric capacitor shall be—$C_{MOS}<|C_{FE}'|<C_{OX}$—to attain non-hysteretic operation and good SS less than 60 mV/dec, FIGS. 9A-9C show simulation results of exemplary semiconductor devices in accordance with some embodiments. As shown in FIG. 9A, x-axis refers to $V_{MOS}$ in FIGS. 7B and 8B while y-axis indicates capacitance value C. The effective oxide thickness (EOT) of the ferroelectric material 708 in FIG. 7A and the ferroelectric material 408 in FIG. 8A are 3 nanometers. Compared to the FIG. 7B, FIG. 8B has an additional variable positive capacitor $C_{SEM}$ including a semiconductor material (such as n-type polysilicon with a doping concentration of about 5 e18/cm^3). The simulation results show that the semiconductor device 800 with the variable positive capacitor $C_{SEM}$ achieves $C_{MOS}<|C_{FE}'|$ for a much wider $V_{MOS}$ range.

As shown in FIG. 9B, the x-axis refers to a difference between $V_G$ and a threshold voltage $V_t$ in FIGS. 7B and 8B while the y-axis indicates drain current $I_D$. The voltage difference between the drain and the source of the devices is 0.5V and the length of the gate is 100 nanometers. Compared to (1) the curve 922 for a general Ge FET, (2) the curve 924 for a FET with ferroelectric material having effective oxide thickness (EOT) of 1 nanometer, and (3) the curve 926 for a FET with ferroelectric material having effective oxide thickness (EOT) of 1.5 nanometers which has significant hysteresis, the curve 928 for the semiconductor device 800 with the effective ferroelectric negative capacitor $C_{FE}'$ reveals an improved subthreshold slope without hysteresis.

As shown in FIG. 9C, the x-axis refers to a voltage difference between $V_G$ and a threshold voltage $V_t$ in FIGS. 7B and 8B while the y-axis indicates subthreshold slope SS. The voltage difference between the drain and the source of the devices is 0.5V and the length of the gate is 100 nanometers. Compared to (1) the curve 932 for a general Ge FET, (2) the curve 934 for the FET with ferroelectric material having effective oxide thickness (EOT) of 1 nanometer, and (3) the curve 936 for the FET with ferroelectric material having effective oxide thickness (EOT) of 1.5 nanometers, the curve 938 for the semiconductor device 800 with the effective ferroelectric negative capacitor $C_{FE}'$ reveals a lower subthreshold slope. Even though the curve 938 exceeds 60 mV/dec at the voltage difference $V_G-V_t$ around 0.3V, it will not influence the operation of the semiconductor device because the device has already turned before that point. As mentioned above, the semiconductor device 800 achieves not only the subthreshold slope less than 60 mV/dec but also non-hysteretic operation.

A description of the simulation method follows. The method includes several steps. The first step is that the electric field of the gate oxide $E_{OX}$ with reference to different $V_{MOS}$ values without $C_{FE}$ is extracted by using CAD tools. Other tools cannot run simulations with ferroelectric material.

Then, math calculations without the CAD tools based on several electrical definition or equations are performed. $C_{FE}$ is considered in this step, and following formula is provided based on the definition of electric displacement field D, wherein $t_{FE}$ represents the thickness of the ferroelectric material, and P is the polarization density:

$$D_{OX} = D_{FE} \Rightarrow \varepsilon_{OX} \cdot E_{OX} = \varepsilon_0 \cdot \frac{V_{FE}(P)}{t_{FE}} + P$$

Additionally, for the ferroelectric material $PbZr_{0.5}Ti_{0.5}O_3$, the following relationship is obtained between $V_{FE}$ and polarization density P based on the Landau model:

$$V_{FE}(P) = t_{FE} \cdot (\alpha P + \beta P^3 + \gamma P^5)$$

$$\begin{cases} \alpha = -4.89 \times 10^7 \text{ m/F} \\ \beta = 4.76 \times 10^7 \text{ m}^5/\text{C}^2\text{F} \\ \gamma = 1.34 \times 10^8 \text{ m}^9/\text{C}^4\text{F} \end{cases}$$

Next, by solving the following equations with the known $t_{FE}$, the relationship between $E_{OX}$ and $V_{FE}$ is obtained:

$$\begin{cases} \varepsilon_{OX} \cdot E_{OX} = \varepsilon_0 \cdot \frac{V_{FE}(P)}{t_{FE}} + P \\ V_{FE}(P) = t_{FE} \cdot (\alpha P + \beta P^3 + \gamma P^5) \end{cases}$$

Since the relationship between $V_{MOS}$ and $E_{OX}$ was obtained in the first step, the relationship between $V_{MOS}$ and $V_{FE}$ in FIG. 8B is retrieved accordingly. With the relationship between $V_{MOS}$ and $V_{FE}$, $V_G$ (which equals to $V_{MOS}+V_{FE}$) can be calculated in FIG. 8B. By the above equation, a plot of the $I_D$-$V_G$ curve of device with $C_{FE}$ or $C_{FE}'$ is made in FIG. 9B.

According to an embodiment, a semiconductor device is provided. The device includes: a substrate and a gate structure over the substrate. The gate structure includes: a gate oxide; a first metal layer over the gate oxide; a ferroelectric material over the first metal layer; a second metal layer over the ferroelectric material; a semiconductor material over the second metal layer; and a third metal layer over the semiconductor material, wherein the second metal layer, the semiconductor material, and the third metal layer forms a variable positive capacitor.

According to an embodiment, a semiconductor device is provided. The device includes: a substrate; and a gate structure on the substrate. The gate structure includes: a ferroelectric negative capacitor; and a variable positive capacitor formed by a semiconductor material.

According to an embodiment, a transistor is provided. The device includes: a source; a drain; and a gate controlling conductivity between the source and the drain. The gate includes: a negative capacitor formed by ferroelectric material; and a variable positive capacitor formed by semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate; and
a gate structure over the substrate, the gate structure comprising:
a gate oxide;
a first metal layer over the gate oxide;
a ferroelectric material over the first metal layer;
a second metal layer over the ferroelectric material;
a semiconductor material over the second metal layer; and
a third metal layer over the semiconductor material,
wherein the second metal layer, the semiconductor material, and the third metal layer form a variable positive capacitor.

2. The semiconductor device of claim 1, wherein the first metal layer, the ferroelectric material, and the second metal layer form a ferroelectric negative capacitor.

3. The semiconductor device of claim 2, wherein the ferroelectric negative capacitor and the variable positive capacitor form an effective ferroelectric negative capacitor, wherein an absolute value of a capacitance of the effective ferroelectric negative capacitor is less than a capacitance of the gate oxide, and further wherein the absolute value of the capacitance of the effective ferroelectric negative capacitor is greater than a combination of the capacitance of the gate oxide and a depletion capacitance of the substrate.

4. The semiconductor device of claim 1, wherein the variable positive capacitor varies with a gate voltage applied to the third metal layer.

5. The semiconductor device of claim 1, wherein the semiconductor material includes polysilicon having a doping concentration of about 1e17/cm^3 to about 1e19/cm^3 and a thickness of about 10 nanometers to about 100 nanometers.

6. The semiconductor device of claim 1, wherein the semiconductor material includes indium gallium zinc oxide having a doping concentration of about 1e16/cm^3 to about 1e19/cm^3 and a thickness of about 10 nanometers to about 100 nanometers.

7. The semiconductor device of claim 1, further comprising:
a source over the substrate; and
a drain over the substrate and separated from the source, wherein a gate voltage applied to the gate structure controls a channel between the source and the drain.

8. A semiconductor device, comprising:
a substrate; and
a gate structure on the substrate, the gate structure comprising:
a ferroelectric negative capacitor; and
a variable positive capacitor formed by a semiconductor material, wherein the ferroelectric capacitor and the variable positive capacitor form a hysteresis-free effective ferroelectric negative capacitor.

9. The semiconductor device of claim 8, wherein the ferroelectric negative capacitor comprises a first metal layer, a ferroelectric material, and a second metal layer.

10. The semiconductor device of claim 8, wherein the variable positive capacitor varies with a gate voltage applied to the gate structure.

11. The semiconductor device of claim 8, wherein the semiconductor device is selected from the group consisting of planar devices, multi-gate devices, FinFETs, and gate-all-around FETs.

12. The semiconductor device of claim 8, further comprising:
 a source over the substrate; and
 a drain over the substrate and separated from the source, wherein a gate voltage applied to the gate structure controls a channel between the source and the drain.

13. A semiconductor device, comprising:
 a substrate; and
 a gate structure on the substrate, the gate structure comprising:
  a ferroelectric negative capacitor; and
  a variable positive capacitor formed by a semiconductor material,
 wherein the variable positive capacitor is formed of a second metal layer, the semiconductor material, and a third metal layer.

14. A semiconductor device, comprising:
 a substrate; and
 a gate structure on the substrate, the gate structure comprising:
  a ferroelectric negative capacitor; and
  a variable positive capacitor formed by a semiconductor material,
 wherein the ferroelectric negative capacitor and the variable positive capacitor form an effective ferroelectric negative capacitor, wherein an absolute value of a capacitance of the effective ferroelectric negative capacitor is less than a capacitance of a gate oxide of the gate structure, and further wherein the absolute value of the capacitance of the effective ferroelectric negative capacitor is greater than a combination of the capacitance of the gate oxide and a depletion capacitance of the substrate.

15. A semiconductor device, comprising:
 a substrate; and
 a gate structure on the substrate, the gate structure comprising:
  a ferroelectric negative capacitor; and
  a variable positive capacitor formed by a semiconductor material,
 wherein the semiconductor material includes polysilicon having a doping concentration of about 1e17/cm^3 to about 1e19/cm^3 and a thickness of about 10 nanometers to about 100 nanometers.

16. A transistor, comprising:
 a source;
 a drain; and
 a gate controlling conductivity between the source and the drain, the gate comprising:
  a negative capacitor formed by a ferroelectric material; and
  a variable positive capacitor formed by a semiconductor material, wherein the negative capacitor and the variable positive capacitor form a hysteresis-free effective ferroelectric capacitor.

17. The transistor of claim 16, wherein the ferroelectric negative capacitor comprises a first metal layer, a ferroelectric material, and a second metal layer.

18. The transistor of claim 16, wherein the variable positive capacitor varies with a gate voltage applied to the gate structure.

19. A transistor, comprising:
 a source;
 a drain; and
 a gate controlling conductivity between the source and the drain, the gate comprising:
  a negative capacitor formed by a ferroelectric material; and
  a variable positive capacitor formed by a semiconductor material,
 wherein the semiconductor material includes polysilicon having a doping concentration of about 1e17/cm^3 to about 1e19/cm^3 and a thickness of about 10 nanometers to about 100 nanometers.

20. A transistor, comprising:
 a source;
 a drain; and
 a gate controlling conductivity between the source and the drain, the gate comprising:
  a negative capacitor formed by a ferroelectric material; and
  a variable positive capacitor formed by a semiconductor material,
 wherein the negative capacitor and the variable positive capacitor form an effective ferroelectric capacitor, wherein an absolute value of a capacitance of the effective ferroelectric negative capacitor is less than a capacitance of a gate oxide of the gate, and further wherein the absolute value of the capacitance of the effective ferroelectric capacitor is greater than a combination of the capacitance of the gate oxide and a depletion capacitance of the substrate.

* * * * *